(12) United States Patent
Nakamura et al.

(10) Patent No.: US 10,461,657 B2
(45) Date of Patent: Oct. 29, 2019

(54) POWER CONVERSION APPARATUS

(71) Applicant: Keihin Corporation, Tokyo (JP)

(72) Inventors: Kazuki Nakamura, Tochigi (JP); Kenichi Sasaki, Tochigi (JP)

(73) Assignee: KEIHIN CORPORATION, Tokyo (JP)

( * ) Notice: Subject to any disclaimer, the term of this patent is extended or adjusted under 35 U.S.C. 154(b) by 0 days.

(21) Appl. No.: 15/823,913

(22) Filed: Nov. 28, 2017

(65) Prior Publication Data
US 2018/0219488 A1   Aug. 2, 2018

(30) Foreign Application Priority Data

Feb. 2, 2017   (JP) ................................ 2017-017630

(51) Int. Cl.
   *H02M 7/00*   (2006.01)
   *H05K 7/20*   (2006.01)
(52) U.S. Cl.
   CPC ........ *H02M 7/003* (2013.01); *H05K 7/20936* (2013.01)
(58) Field of Classification Search
   CPC ........................... H02M 7/003; H05K 7/20936
   USPC ....................................................... 361/698
   See application file for complete search history.

(56) References Cited

U.S. PATENT DOCUMENTS

| | | | | |
|---|---|---|---|---|
| 8,531,822 B2* | 9/2013 | Said | ..................... | H05K 7/1432 361/677 |
| 8,867,210 B2* | 10/2014 | Harmelink | ......... | H05K 7/20254 165/104.33 |
| 2007/0215316 A1* | 9/2007 | Saito | ..................... | H02M 7/003 165/41 |
| 2010/0188813 A1* | 7/2010 | Nakatsu | ................ | H02M 7/003 361/689 |
| 2010/0283337 A1* | 11/2010 | Omiya | .................. | B60K 6/445 310/64 |
| 2012/0212175 A1* | 8/2012 | Sharaf | ................ | H04K 7/20272 320/107 |
| 2015/0289411 A1* | 10/2015 | Kamiya | ................ | H01L 25/071 361/701 |
| 2017/0005581 A1* | 1/2017 | Fukumasu | .............. | H02M 3/28 |

FOREIGN PATENT DOCUMENTS

JP   2015-130735   7/2015

\* cited by examiner

*Primary Examiner* — Mukundbhai G Patel
(74) *Attorney, Agent, or Firm* — Rankin, Hill & Clark LLP

(57) ABSTRACT

A power conversion device includes a first cooler configured to cool a power module, a second cooler configured to cool at least one electronic component, and a housing configured to house the first cooler and the second cooler. The power conversion device also includes a connecting coolant passage formed in an inner wall of the housing such that the connecting coolant passage connects the first cooler to the second cooler. The power conversion device can have the connecting coolant passage formed in the housing, without enlarging a size of the housing. The strength of a side wall of the housing is enhanced because the connecting coolant passage is formed in the inner wall of the housing.

10 Claims, 4 Drawing Sheets

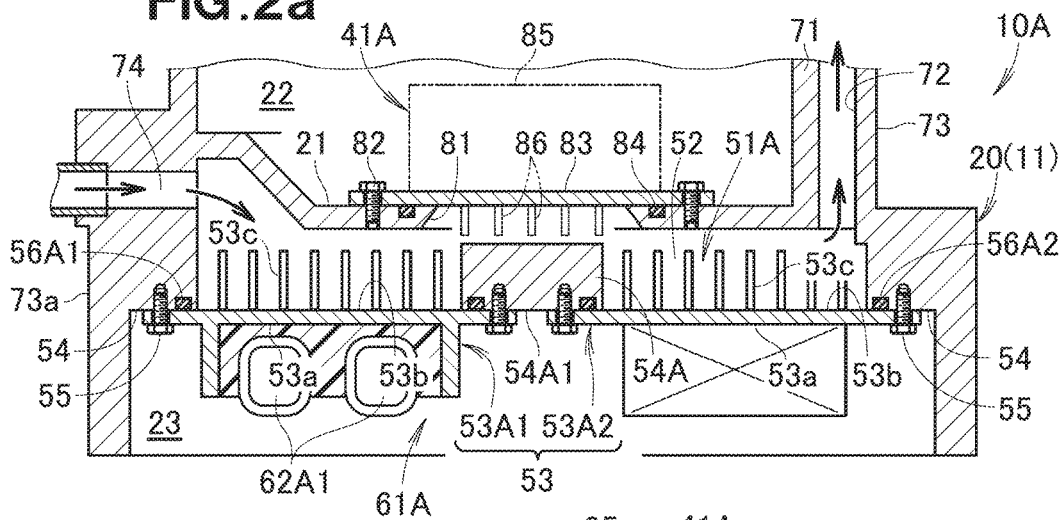
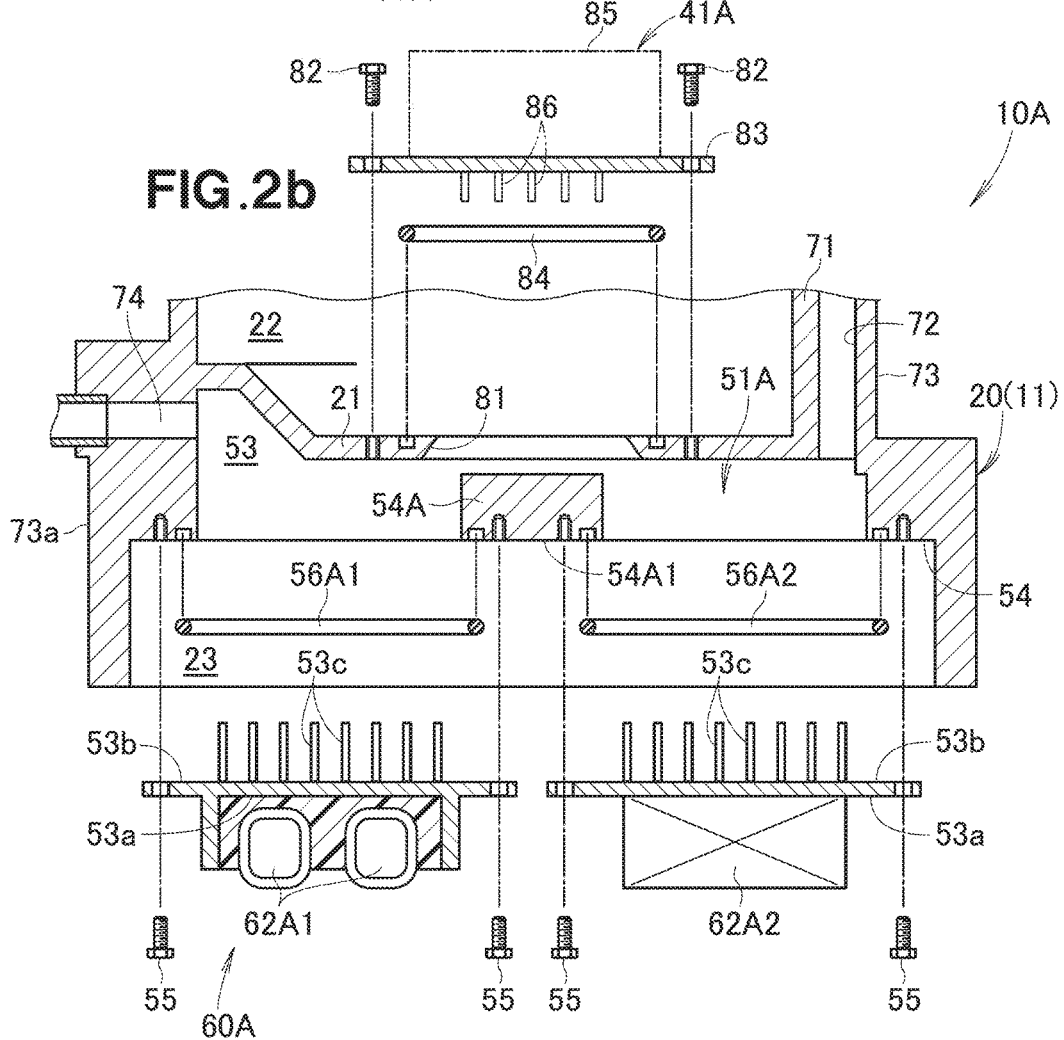

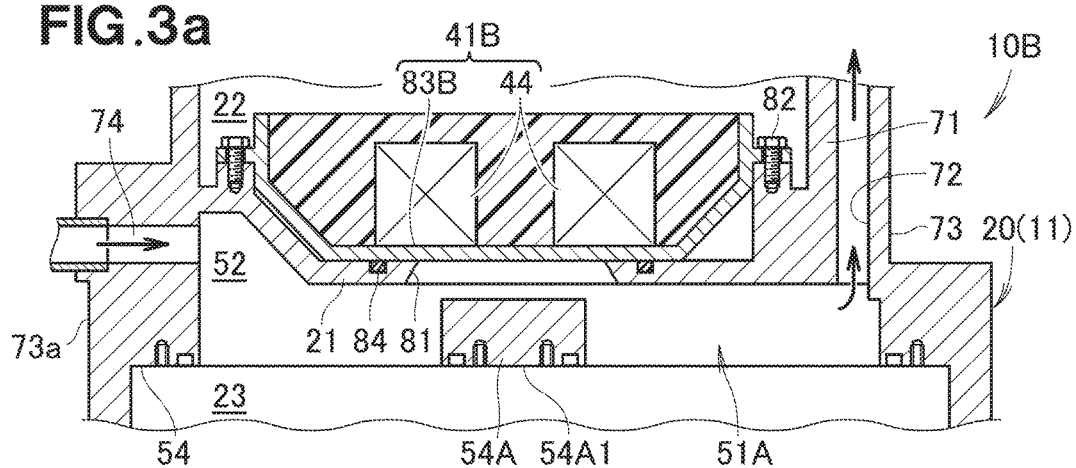
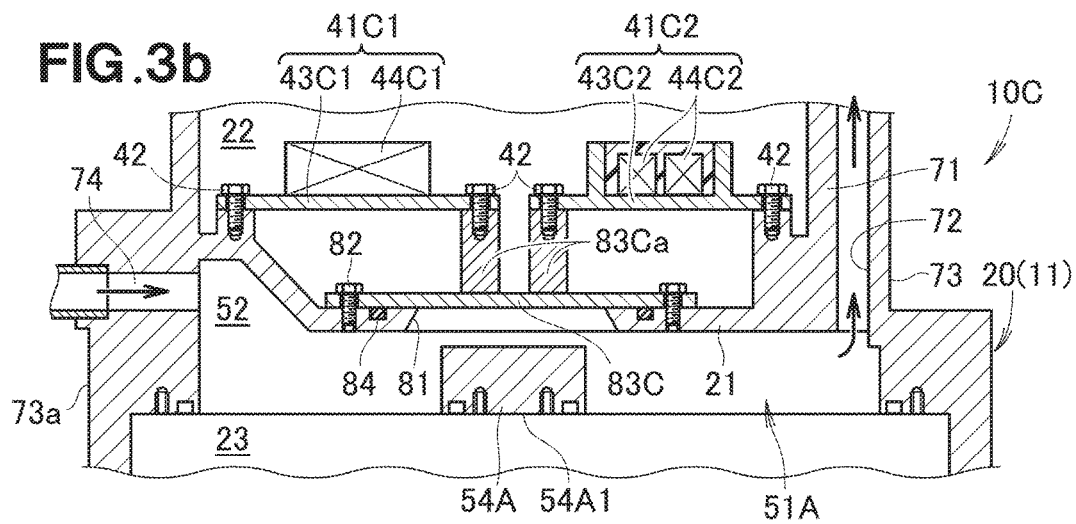
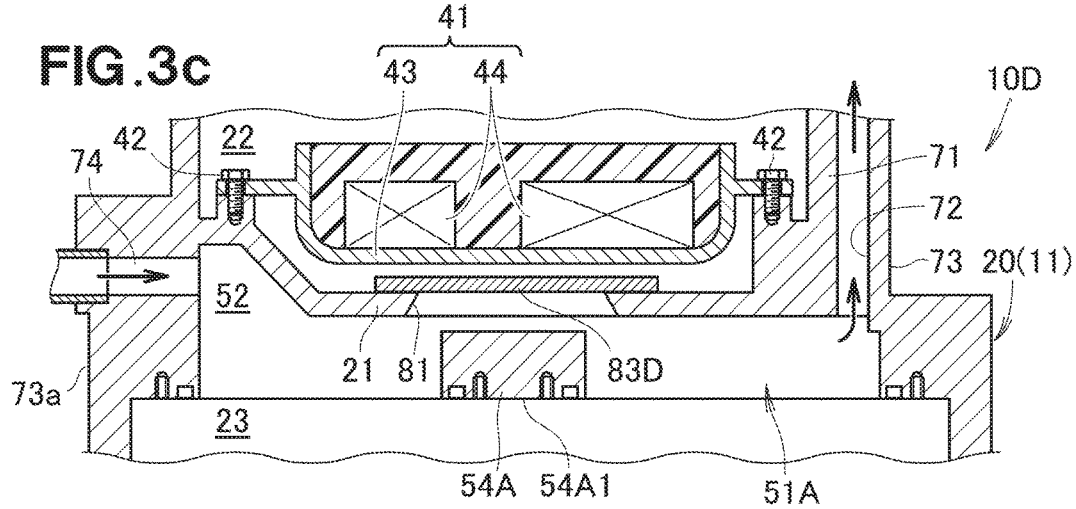

POWER CONVERSION APPARATUS

FIELD OF THE INVENTION

The present invention relates to improvements in power conversion apparatuses.

BACKGROUND OF THE INVENTION

A power conversion apparatus is disposed, for example, between a battery and a motor. The power conversion apparatus controls power stored in the battery and supplies the power to the motor. Many subunits (e.g., power module, electric reactor) in a power conversion apparatus, namely, a PCU (power control unit) provided in a hybrid vehicle or an electric vehicle produce heat, and the heat may adversely affect the performance of the power conversion apparatus. Thus, a cooling structure is essential. A variety of such cooling techniques have been proposed (e.g., Japanese Patent Application Laid-Open Publication No. 2015-130735).

The power conversion apparatus disclosed in Japanese Patent Application Laid-Open Publication No. 2015-130735 includes a housing that is divided into a first housing portion (i.e., an upper half) and a second housing portion (i.e., a lower half), and the first and second housing portions are assembled to a single unit. The first housing portion houses a first power converter and a first cooler that are integrated into a unit. The second housing portion serves as a second cooler, and a second power converter is mounted inside the second housing portion. In this manner, the cooler is divided into the first cooler and the second cooler, and the first and second coolers are connected to each other via a connecting coolant passage provided outside the housing. The connecting coolant passage includes a first coolant passage and a second coolant passage. The first coolant passage is formed in a first projection portion that projects from an outer surface of the first housing portion. The second coolant passage is formed in a second projection portion that projects from an outer surface of the second housing portion.

However, since the connecting coolant passage is provided outside the housing in this structure, the size of the housing increases. Furthermore, since the second power converter is mounted inside the second housing portion serving as the second cooler, it is difficult to form a cooling fin or fins in/on the second housing portion. It is also difficult to alter the size of the cooler. Thus, use of this structure is limited to certain applications.

SUMMARY OF THE INVENTION

An object of the present invention is to provide a configuration that has a connecting coolant passage formed in a housing, without enlarging a size of the housing.

According to a first aspect of the present invention, there is provided a power conversion apparatus that includes a first cooler configured to cool a power module, a second cooler configured to cool at least one electronic component, and a housing configured to house the first cooler and the second cooler. The power conversion apparatus also includes a connecting coolant passage formed in an inner wall of the housing, and configured to connect the first cooler to the second cooler.

According to a second aspect of the present invention, the second cooler of the power conversion apparatus may have a groove portion provided in the housing, and a lid portion fixed to the housing to cover or close the groove portion. The electronic component(s) may be mounted on the lid portion.

According to a third aspect of the present invention, the lid portion of the power conversion apparatus may have at least one cooling fin on a face opposite to a mounting face of the lid portion, on which the electronic components are mounted.

According to a fourth aspect of the present invention, the lid portion of the power conversion apparatus may be divided into a plurality of pieces and fixed such that these pieces correspond to the electronic components, respectively.

According to a fifth aspect of the present invention, the pieces of the lid portion may include two pieces. One of the two pieces may have a through hole, and the other may be placed and fixed over the through hole to close the through hole.

According to a sixth aspect of the present invention, a coolant inlet of the first cooler, a coolant inlet of the second cooler, a coolant outlet of the first cooler and a coolant outlet of the second cooler may be formed in a same face of the housing.

In the invention of the first aspect, the connecting coolant passage that connects to the two coolers with each other is provided in the inner wall of the housing. Therefore, it is possible to have the connecting coolant passage formed in the housing, without increasing a size of the housing. In addition, because the connecting coolant passage is provided in the inner wall of the housing, it is possible to enhance the strength of a side wall (or side walls) of the housing.

In the invention of the second aspect, the electronic components are mounted on the lid portion. Therefore, replacement of the electronic components is done by simply replacing the lid portion with a new lid portion. This enhances the versatility of the power conversion apparatus.

In the invention of the third aspect, the electronic components are directly mounted on the lid portion that has the cooling fins formed thereon. Therefore, the shape of the cooling fins can be changed by simply replacing the lid portion with a new lid portion, and the electronic components can be changed by simply replacing the lid portion with a new lid portion. This enhances the versatility of the power conversion apparatus.

In the invention of the fourth aspect, the lid portion is divided into pieces such that these lid pieces correspond to the electronic components, respectively. When a plurality of electronic components are mounted on the single lid portion, all the electronic components must be replaced with new electronic components upon replacing of the single lid portion. In contrast, when the invention of the fourth aspect is employed, it is possible to replace one electronic component, together with an associated lid piece, with another electronic component. This enhances the versatility of the power conversion apparatus.

In the invention of the fifth aspect, the lid pieces are united (to a single sheet) and fixed onto the housing. Therefore, it is not necessary for the lid pieces to individually open the groove portion of the housing. It is possible to simplify the structure of the power conversion apparatus.

In the invention of the sixth aspect, the coolant inlets and the coolant outlets are formed in the same face of the housing. Therefore, it is possible to reduce the size of the housing (achieve the downsizing of the housing).

BRIEF DESCRIPTION OF THE DRAWINGS

FIG. 2(a) is similar to FIG. 1, and illustrates a cross-sectional view of a structure around a second room of a power conversion apparatus according to Modification 1.

FIG. 2(b) is an exploded view of the power conversion apparatus illustrated in FIG. 2(a).

FIG. 3(a) is similar to FIG. 2(a), and illustrates a cross-sectional view of a structure around a second room of a power conversion apparatus according to Modification 2.

FIG. 3(b) is similar to FIG. 2(a), and illustrates a cross-sectional view of a structure around a second room of a power conversion apparatus according to Modification 3.

FIG. 3(c) is similar to FIG. 2(a), and illustrates a cross-sectional view of a structure around a second room of a power conversion apparatus according to Modification 4.

DETAILED DESCRIPTION OF THE PREFERRED EMBODIMENTS

Hereinafter, an embodiment for implementing the present invention will be described with reference to the accompanying drawings.

Embodiments

A power conversion apparatus according to an embodiment will be described with reference to a drawing.

Figure 1:
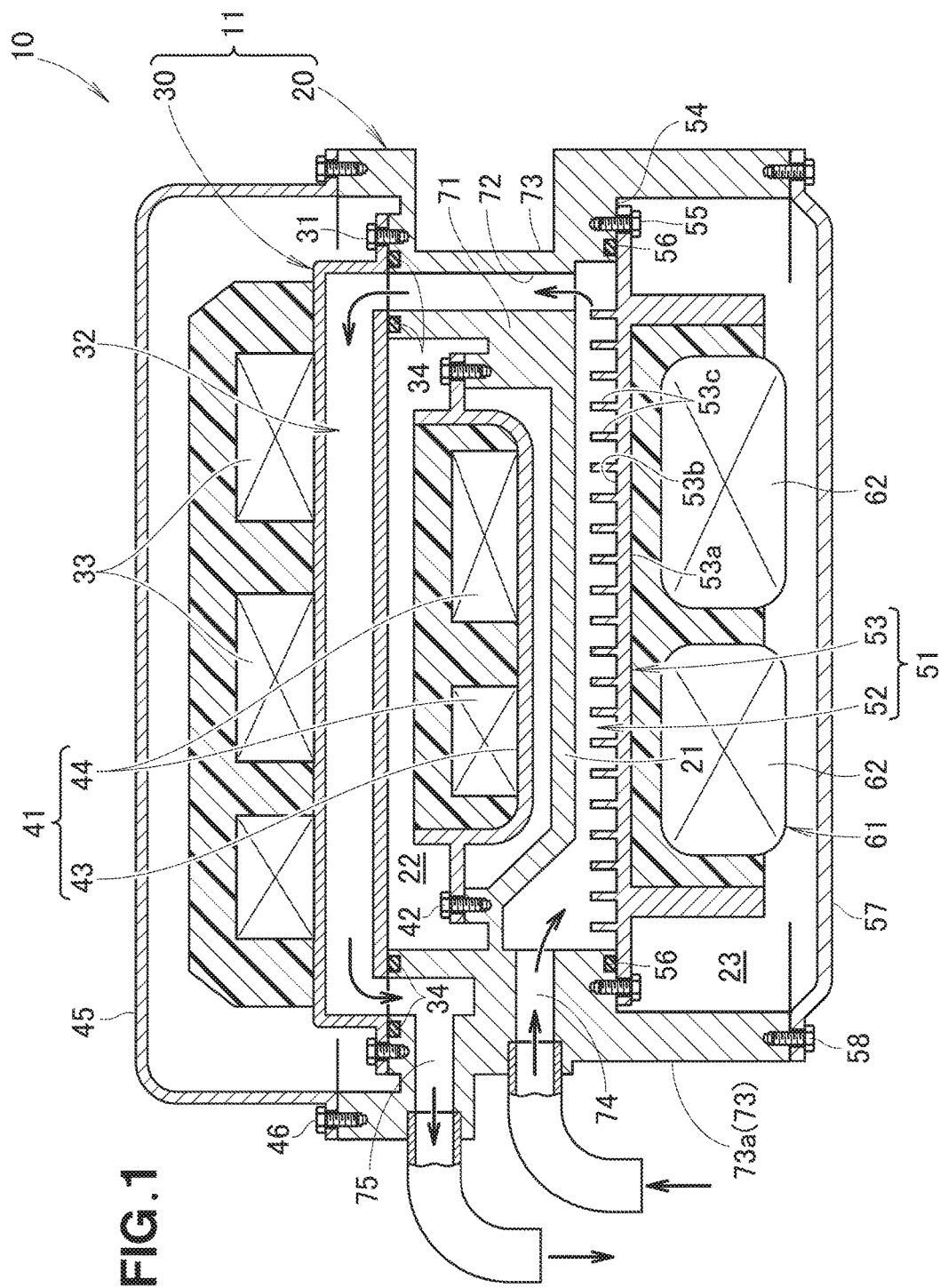
FIG. 1 is a schematic cross-sectional view of a power conversion apparatus according to an embodiment of the present invention.

As illustrated in FIG. 1, a power conversion apparatus 10 includes a housing 11, and the housing 11 houses power modules 33 and various electronic components 44 and 62. The housing 11 has a main body 20 (shell 20) and a coolant jacket 30. The main body 20 is divided into a first room 22 and a second room 23 by a compartment plate (partition plate) 21. The compartment plate 12 is formed integrally with the main body 20. For example, the first room 22 is located directly above the second room 23.

The coolant jacket 30 covers (or closes) the open end of the first room 22 opposite to the compartment plate 21. The coolant jacket 30 is a substantially planar member, which is detachably mounted on the first room 22 by bolts 31, and has a first cooler 32 therein. The power modules 33 are mounted on an outer surface of the coolant jacket 30. The first cooler 32 is a coolant passage formed in the coolant jacket 30 to cool the power modules 33. An inlet and an outlet of the first cooler 32 are sealed by sealing members 34 and 34, such as O-rings.

The first room 22 houses a first subunit 41. The first subunit 41 has a base 43, which is detachably mounted on the compartment plate 21 by bolts 42, and the electronic components 44 (e.g., smoothing capacitor, electric reactor, DC-DC converter, discharge resistance, etc.) mounted on the base 43. The coolant jacket 30 and the power modules 33 are covered by a first cover 45. The first cover 45 is detachably mounted on the housing 11 by bolts 46.

The second room 23 has a second cooler 51. The second cooler 51 includes a groove portion 52 provided inside the housing 11, and a lid portion 53 fixed to the housing 11 to cover the groove portion 52. The groove portion 52 is formed along the compartment plate 21 in the second room 23 and opens on the side (lower side) opposite to the compartment plate 21. The shape and the size of the groove portion 52 are appropriately decided in consideration of the cooling performance (including the cooling area) of the second cooler 51. For example, the groove portion 52 is formed into a narrow, elongated groove or a wide groove extending substantially across the entire surface of the compartment plate 21. The lid portion 53 faces the compartment plate 21 and closes the open end of the groove portion 52 on the lower side.

More specifically, a flat seat 54 is formed along the periphery of the open end of the groove portion 52 in the second room 23. The lid portion 53 is superposed on the seat 54 and detachably mounted thereon by bolts 55. An interface between the lid portion 53 and the seat 54 is sealed by s sealing member 56, such as an O-ring. A second cover 57 covers the open end of the second room 23 opposite to the compartment plate 21. The second cover 57 is detachably mounted on the main body 20 by bolts 58.

The second room 23 houses a second subunit 61. The second subunit 61 has the lid portion 53 and the electronic components 62 (e.g., smoothing capacitor, electric reactor, DC-DC converter, discharge resistance, etc.) mounted on the lid portion 53. As the electronic components 62 are mounted on the lid portion 53, the electronic components 62 can be altered by simply replacing the lid portion 53 with another lid portion. This enhances versatility of the power conversion apparatus 10.

Furthermore, the lid portion 53 includes a mounting surface 53a on which the electronic components 62 are mounted and a surface 53b on the opposite side (the surface 53b opposing the groove portion 52). A plurality of cooling fins 53c are formed on the surface 53b. The cooling fins 53c extend into the groove portion 52. The shape of the cooling fins 53c can be altered by simply replacing the lid portion 53 with another lid portion. This enhances the versatility of the power conversion apparatus 10.

The second cooler 51 is connected to a coolant inlet 74 provided in the housing 11 (main body 20). The first cooler 32 is connected to a coolant outlet 75 provided in the housing 11 (main body 20). The coolant inlet 74 and the coolant outlet 75 are preferably formed in a certain surface 73a of a side wall 73 of the housing 11 (main body 20), and located on the side opposite to a connecting coolant passage 72.

As the coolant inlet 74 and the coolant outlet 75 are formed in the same face 73a of the housing 11 such that the coolant inlet 74 and the coolant outlet 75 are concentrated on one side, the size of the housing 11 can be reduced (downsizing is achieved). Furthermore, no coolant piping is required in a portion of the housing 11 where the coolant inlet 74 and the coolant outlet 75 are not provided, namely, in the portion opposite to the coolant inlet 74 and the coolant outlet 75. Thus, the installation space where the power conversion apparatus 10 and the peripheral components thereof are disposed can be reduced. Accordingly, the power conversion apparatus 10 can be disposed in a small space, which leads to increased arrangement flexibility. For example, when the power conversion apparatus 10 is mounted in a vehicle, the size of the vehicle can be reduced effectively.

Coolant (e.g., cooling water) supplied through the coolant inlet 74 passes through the second cooler 51, the connecting coolant passage 72, and the first cooler 32 and is discharged through the coolant outlet 75. The coolant that flows in the first cooler 32 directly cools the power modules 33 via the coolant jacket 30. The coolant that flows in the second cooler 51 directly cools the electronic components 62 via the cooling fins 53c and the lid portion 53. Thus, the coolant can directly and efficiently cool the power modules 33 and the electronic components 62. Therefore, the integration efficiency (density) of the power modules 33 and the electronic components 62 can be increased, and the size of the power conversion apparatus 10 can be reduced. In addition, since the configuration is not that the coolant indirectly cools components, radiating grease need not be applied, and the cost can be reduced correspondingly. Furthermore, since the cooling fins 53c are provided, the electronic components 62 can be cooled even more efficiently.

In addition, since the first room 22 is surrounded by the first cooler 32 and the second cooler 51, the ambient temperature inside the first room 22 can be lowered. Thus, the electronic components 44 disposed in the first room 22 can be cooled indirectly.

As is clear from the foregoing description, the power conversion apparatus 10 includes the first cooler 32 configured to cool the power modules 33, the second cooler 51 configured to cool the electronic components 62, and the housing 11 configured to house the first cooler 32 and the second cooler 51.

The connecting coolant passage 72 that connects the first cooler 32 to the second cooler 51 is provided in an inner wall 71 (the inner wall 71 of the main body 20) of the housing 11. Thus, the connecting coolant passage 72 can be formed inside the housing 11 without increasing the size of the housing 11. In addition, as the connecting coolant passage 72 is provided in the inner wall 71 of the housing 11, the strength of the side wall 73 (the side wall 73 of the main body 20) of the housing 11 can be improved.

Various modifications to the power conversion apparatus 10 illustrated in FIG. 1 will now be described. Basic configurations of the modifications are the same as those of the power conversion apparatus 10 illustrated in FIG. 1, and identical configurations are given identical reference characters with their descriptions omitted. The modifications provide the same advantageous effects as the power conversion apparatus 10 illustrated in FIG. 1.

Modification 1

A power conversion apparatus 10A according to Modification 1 will be described with reference to FIGS. 2(a) and 2(b). FIG. 2(a) illustrates a cross-sectional view of a structure around the second room 23 of the power conversion apparatus 10A according to Modification 1 and corresponds to FIG. 1. FIG. 2(b) illustrates an exploded view of the power conversion apparatus 10A illustrated in FIG. 2(a).

The configuration of the power conversion apparatus 10A according to Modification 1 is the same as that of the power conversion apparatus 10 illustrated in FIG. 1 except that the second subunit 61 illustrated in FIG. 1 is modified to a second subunit 61A. Specifically, the lid portion 53 is divided and fixed so as to correspond to a plurality of (e.g., two) electronic components 62A1 and 62A2 disposed in the second room 23.

The lid portion 53 of the second subunit 61A is divided into a first lid portion (first lid piece) 53A1 and a second lid portion (second lid piece) 53A2 such that the first and second lid portions 53A1 and 53A2 correspond to the two electronic components 62A1 and 62A2, respectively. A second cooler 51A has the groove portion 52 provided inside the housing 11, and the lid portions 53A1 and 53A2 fixed to the housing 11 to cover the groove portion 52. The second subunit 61A housed in the second room 23 has the first electronic component 62A1 mounted on the first lid portion 53A1, and the second electronic component 62A2 mounted on the second lid portion 53A2. Thus, the degree of integration and the arrangement flexibility of the electronic components 62A1 and 62A2 can be increased.

An intermediate base 54A is integrally formed midway in the groove portion 52 of the second cooler 51A. The intermediate base 54A includes an auxiliary seat 54A1, which is necessary to seal the entire peripheral surfaces of the lid portions 53A1 and 53A2 with respect to the seat 54 in the second room 23. The seat 54A1 of the intermediate base 54A is flush with the seat 54 of the second room 23. The lid portions 53A1 and 53A2 are superposed on the seats 54 and 54A1 and detachably mounted thereon by the bolts 55. Interfaces between the lid portions 53A1 and 53A2 and the seats 54 and 54A1 are sealed by sealing members 56A1 and 56A2, such as O-rings, across the entire peripheral surfaces of the lid portions 53A1 and 53A2. Thus, although the groove portion 52 is covered with the divided lid portions 53A1 and 53A2, sufficient sealing performance can be ensured by the sealing members 56A1 and 56A2.

In this manner, the lid portion 53 (see FIG. 1) is divided into the lid portions 53A1 and 53A2 such that the lid portions 53A1 and 53A2 correspond to the electronic components 62A1 and 62A2, respectively, in Modification 1. As illustrated in FIG. 1, in a case where a single lid portion 53 is provided and the electronic components 62 and 62 are mounted on the lid portion 53, the entire lid portion 53 is to be replaced with another lid portion when the electronic components are modified. In contrast, in the case of Modification 1, the divided lid portions 53A1 and 53A2 corresponding to the electronic components 62A1 and 62A2 can be replaced separately. This increases the versatility of the power conversion apparatus 10A.

Since the intermediate base 54A is provided midway in the groove portion 52, at least a portion of the flow passage in the second cooler 51A is blocked by the intermediate base 54A. In this respect, a through hole 81 is formed in the compartment plate 21. The through hole 81 is in the same phase as (located directly above) the intermediate base 54A and is closed by a coolant lid 83.

The coolant lid 83 is superposed on the compartment plate 21 and mounted thereon by bolts 82 from the side of the first room 22. An interface between the compartment plate 21 and the coolant lid 83 is sealed by a sealing member 84, such as an O-ring. Consequently, a bypass passage of the groove portion 52 is formed between the intermediate base 54A and the coolant lid 83. The depth of this bypass passage corresponds to at least the thickness of the compartment plate 21. Although the intermediate base 54A is present midway in the groove portion 52, the second cooler 51A can bypass the portion where the intermediate base 54A is present. Thus, while the sealing performance of the divided lid portions 53A1 and 53A2 is ensured, the cooling performance of the second cooler 51A can be ensured by easily securing the flow passage of the second cooler 51A.

In Modification 1, as indicated by imaginary lines in FIGS. 2(a) and 2(b), an electronic component 85 (e.g., smoothing capacitor, electric reactor, DC-DC converter, discharge resistance, etc.) and a plurality of cooling fins 86 can be provided on the coolant lid 83. The electronic component 85 is mounted on the surface of the coolant lid 83 on the side of the first room 22. In other words, the coolant lid 83 also serves as a base on which the electronic component 85 is mounted. The coolant lid 83 and the electronic component 85 constitute a first subunit 41A in Modification 1. The cooling fins 86 extend from the coolant lid 83 toward the through hole 81. The coolant that flows in the second cooler 51A directly cools the electronic component 85 via the cooling fins 86 and the coolant lid 83. Thus, the coolant can directly and efficiently cool the electronic component 85.

Modification 2

A power conversion apparatus 10B according to Modification 2 will be described with reference to FIG. 3(a). FIG. 3(a) illustrates a cross-sectional view of a structure around the second room 23 of the power conversion apparatus 10B according to Modification 2 and corresponds to FIG. 2. The power conversion apparatus 10B of Modification 2 is characterized by a configuration that the coolant lid 83 of Modification 1 shown in FIG. 2(a) is replaced with a coolant lid 83B shown in FIG. 3(a). Other configurations of the power conversion apparatus 10B of Modification 2 are the same as those of the power conversion apparatus 10A of Modification 1. Similar to the coolant lid 83 of Modification 1, the coolant lid 83B closes the through hole 81 of the compartment plate 21, and serves as the base 43 of the first subunit 41 shown in FIG. 1. The coolant lid 83B is superposed on the compartment plate 21 from the side of the first room 22, and is mounted thereon by bolts 82.

In other words, the first subunit 41B of Modification 2 has the coolant lid 83B and the electronic components 44 mounted on the coolant lid 83B. In this manner, it is possible to further increase the degree of integration and the arrangement flexibility of the electronic components, as compared to Modification 2. Also, because the coolant lid 83B serves as the base 43 of the first subunit 41 of FIG. 1, no additional parts are needed. In addition, the coolant that flows in the second cooler 51A directly cools the electronic components 44 via the coolant lid 83B. Thus, it is possible to directly and efficiently cool the electronic components 44.

Modification 3

A power conversion apparatus 10C according to Modification 3 will be described with reference to FIG. 3(b). FIG. 3(b) illustrates a cross-sectional view of a structure around the second room 23 of the power conversion apparatus 10C according to Modification 3 and corresponds to FIG. 2(a). The power conversion apparatus 10C of Modification 3 is characterized by a configuration that the coolant lid 83 of Modification 1 shown in FIG. 2(a) is replaced with a coolant lid 83C shown in FIG. 3(b). Other configurations of the power conversion apparatus 10C of Modification 3 are the same as those of the power conversion apparatus 10A of Modification 1. Similar to the coolant lid 83 of Modification 1, the coolant lid 83C closes the through hole 81 of the compartment plate 21, and it has a plurality of bosses 83Ca and 83Ca that project upward from an upper surface thereof.

In addition, the first subunit 41 shown in FIG. 1 is divided into two first subunits 41C1 and 41C2 in Modification 3. One of these two first subunits, namely the first subunit 41C1, has a base 43C1 and an electronic component 44C1. The other first subunit 41C2 has a base 43C2 and an electronic component 44C2. The base 43C1 is mounted on the compartment plate 21 and one of the two bosses 83Ca by bolts 42, and the base 43C2 is mounted on the compartment plate 21 and the other boss 83Ca by bolts 42. In this manner, it is possible to further increase the degree of integration and the arrangement flexibility of the electronic components, as compared to Modification 2.

Modification 4

A power conversion apparatus 10D according to Modification 4 will be described with reference to FIG. 3(c). FIG. 3(c) illustrates a cross-sectional view of a structure around the second room 23 of the power conversion apparatus 10D according to Modification 4 and corresponds to FIG. 2(a). The power conversion apparatus 10D of Modification 4 is characterized by a configuration that the coolant lid 83 of Modification 1 shown in FIG. 2(a) is replaced with a coolant lid 83D shown in FIG. 3(c). Other configurations of the power conversion apparatus 10D of Modification 4 are the same as those of the power conversion apparatus 10A of Modification 1. The coolant lid 83D is sealedly fixed onto the compartment plate 21 by a joining technique, such as friction stir welding, rather than being fixed on the compartment plate 21 by bolts. The first subunit 41 has the same structure as the first subunit shown in FIG. 1. The first subunit 41 is located directly above the coolant lid 83D, and mounted on the compartment plate 21 by the bolts 42. In this manner, it is possible to further increase the degree of integration and the arrangement flexibility of the electronic components 44, as compared to the electronic component 85 of Modification 1.

Modification 5

Figure 4A:
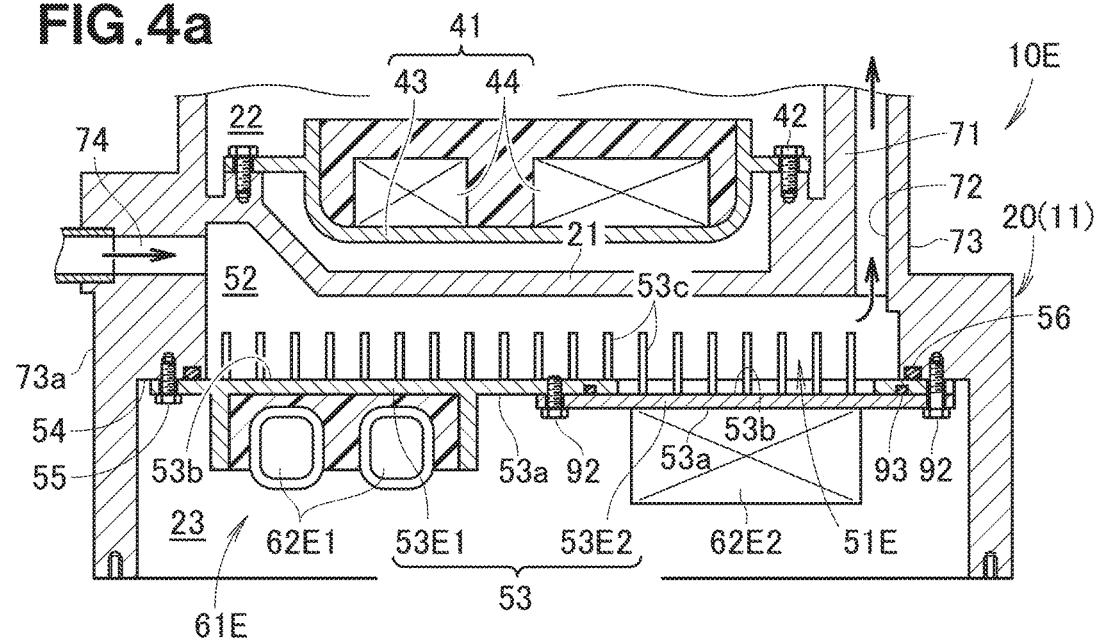
FIG. 4(a) is similar to FIG. 1, and illustrates a cross-sectional view of a structure around a second room of a power conversion apparatus according to Modification 5.
Figure 4B:
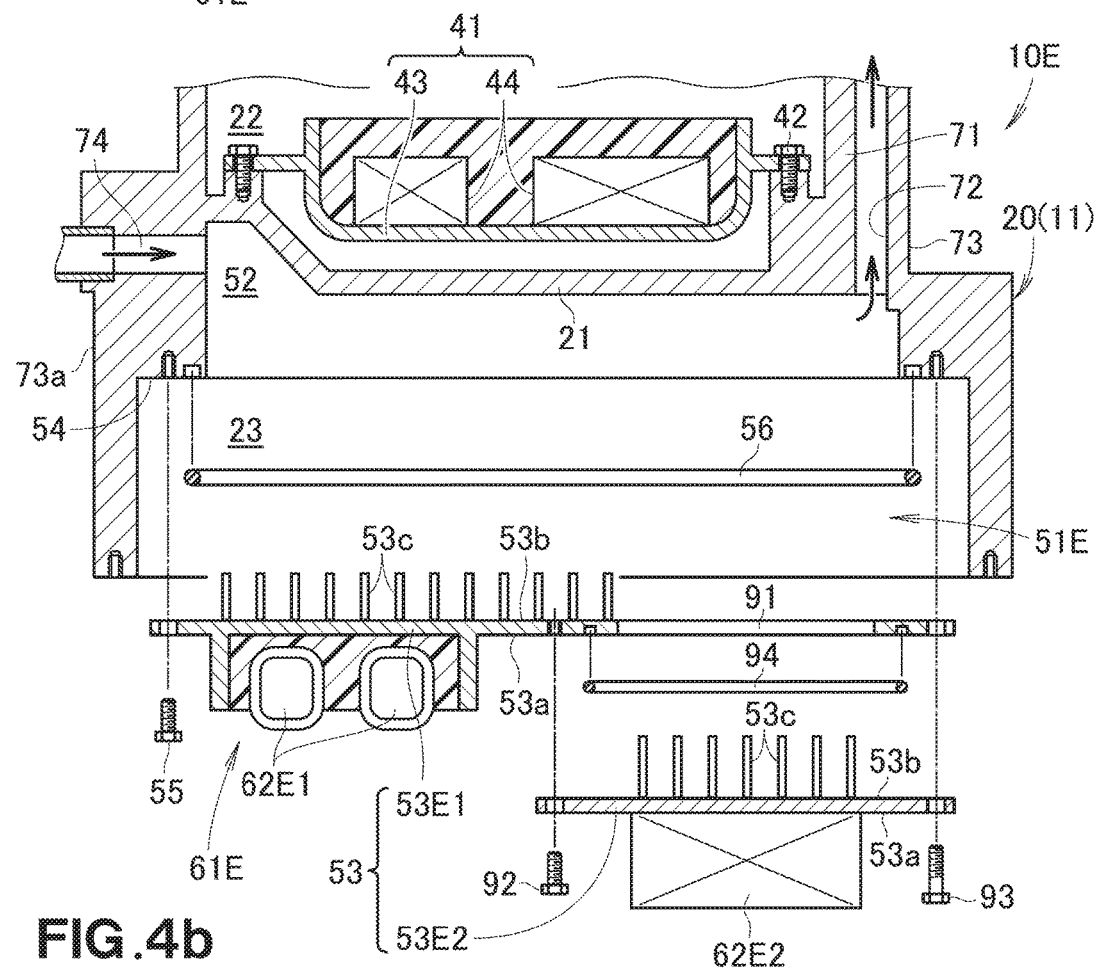
FIG. 4(b) is an exploded view of the power conversion apparatus shown in FIG. 4(a).

A power conversion apparatus 10E according to Modification 5 will be described with reference to FIGS. 4(a) and 4(b). FIG. 4(a) illustrates a cross-sectional view of a structure around the second room 23 of the power conversion apparatus 10E according to Modification 5 and corresponds to FIG. 1. FIG. 4(b) is an exploded view of the power conversion apparatus 10E shown in FIG. 4(a). The power conversion apparatus 10E of Modification 5 has two structural features, which will be described below, and other configurations of the power conversion apparatus 10E are the same as those of the power conversion apparatus 10 shown in FIG. 1.

Firstly, the second subunit 61 shown in FIG. 1 is replaced with a second subunit 61E of Modification 5. Specifically, the lid portion 53 is divided into a plurality of pieces and fixed such that the lid pieces correspond to a plurality of (e.g., two) electronic components 62E1 and 62E2 arranged in the second room 23. The lid portion 53 of the second subunit 61E is divided into a first lid piece 53E1 and a second lid piece 53E2 such that the two lid pieces 53E1 and 53E2 corresponds to the two electronic components 62E1 and 62E2, respectively.

Secondly, a through hole 91 is formed in one of the lid pieces 53E1 and 53E2, i.e., the lid piece 53E1, and the other lid piece 53E2 is fixed over the lid piece 53E1 to close the through hole 91. Specifically, the first lid piece 53E1 has the basically same structure as the lid portion 53 shown in FIG. 1, and is placed on the seat 54 and detachably mounted on the seat 54 by the bolts 55. The second cooler 51E has the groove portion 52 provided inside the housing 11, and the lid pieces 53E1 and 53E2 fixed onto the housing 11 to close the groove portion 52.

The through hole 91 is formed in part of the first lid piece 53E1. The second lid piece 53E2 is placed over the mounting surface 53a of the first lid piece 53E1, and detachably mounted thereon by bolts 92. It should be noted that the second lid piece 53E2 may be mounted on the main body 20 together with the first lid piece 53E1 by some of bolts 93. An interface between the first lid piece 53E1 and the second lid piece 53E2 is sealed by a sealing member 94 such as an O-ring.

The first electronic component 62E1 is mounted on the mounting surface 53a of the first lid piece 53E1. The second electronic component 62E2 is mounted on the mounting surface 53a of the second lid piece 53E2. A plurality of cooling fins 53c are provided on a surface 53b of the first lid piece 53E1 and a surface 53b of the second lid piece 53E2. The surfaces 53b and 53b face the groove portion 52. The surfaces 53b and 53b are opposite to the mounting surfaces 53a and 53a.

In this manner, the lid pieces 53E1 and 53E2 are united (to a single sheet), and fixed onto the housing 30. Thus, it is not necessary to individually open the groove portion 52 of the housing 30 with the lid pieces 53E1 and 53E2. This contributes to simplification of the structure of the power conversion apparatus 10E. Even though the groove portion 52 is closed by the lid pieces 53E1 and 53E2, it is still possible to ensure the sealing capability of the sealing members 56 and 94 in a sufficient manner. Furthermore, it is possible to increase the degree of integration and the arrangement flexibility of the electronic components 62E1 and 62E2.

It should be noted that the power conversion apparatuses 10 and 10A-10D may be mounted not only on an electric vehicle or a so-called hybrid vehicle, but on a boat, a ship or a general industrial machine/equipment.

It should also be noted that the housing 11 is not limited to a configuration that separately includes the main body 20 and the coolant jacket 30. For example, the main body 20 may be united to the coolant jacket 30 such that the housing 11 has a one-piece structure.

It should also be noted that provision of the first cover 45 and the second cover 57 shown in FIG. 1 is arbitrary (these covers may be dispensed with).

INDUSTRIAL APPLICABILITY

The present invention may advantageously be used for a power conversion apparatus mounted in a vehicle.

What is claimed is:

1. A power conversion apparatus comprising:
a first cooler configured to cool a power module;
a second cooler configured to cool at least one first electronic component provided therein;
a housing configured to house the first cooler and the second cooler, the housing comprising a main body, a compartment plate which divides the main body to define a first room housing at least one second electronic component and a second room in which the second cooler is provided, and a coolant jacket which has the first cooler therein and is mounted on the main body so as to cover an open end of the first room; and
a connecting coolant passage entirely defined within an inner wall of the main body, the connecting coolant passage being directly connected to each of the first cooler and the second cooler so as to connect the first cooler to the second cooler,
wherein the first room and the second room are interposed between the first cooler and the second cooler.

2. The power conversion apparatus according to claim 1, wherein the second cooler has a groove portion provided in the housing, and a lid portion fixed to the housing to cover the groove portion, and
said at least one first electronic component is mounted on the lid portion.

3. The power conversion apparatus according to claim 2, wherein the lid portion has at least one cooling fin on a face opposite to a mounting face of the lid portion, on which said at least one first electronic component is mounted.

4. The power conversion apparatus according to claim 2, wherein said at least one first electronic component includes a plurality of first electronic components, and the lid portion is divided into a plurality of pieces and fixed such that the plurality of pieces correspond to the plurality of first electronic components, respectively.

5. The power conversion apparatus according to claim 4, wherein the plurality of pieces of the lid portion includes two pieces, one of the two pieces has a through hole, and the other is placed and fixed over the through hole to close the through hole.

6. The power conversion apparatus according to claim 1, wherein a coolant inlet and a coolant outlet are formed in a same face of the housing and in fluid communication with the first cooler and the second cooler.

7. The power conversion apparatus according to claim 6, wherein the connecting coolant passage connects the first cooler to the second cooler in series, wherein coolant supplied to the coolant inlet passes in order through the first cooler, directly to the connecting coolant passage, directly to the second cooler, and a coolant outlet.

8. The power conversion apparatus according to claim 1, wherein the connecting coolant passage connects the first cooler to the second cooler in series, wherein coolant supplied to a coolant inlet passes in order through the first cooler, directly to the connecting coolant passage, directly to the second cooler, and a coolant outlet.

9. The power conversion apparatus according to claim 1, further comprising a coolant lid mounted to the compartment plate and configured to close a through hole defined in the compartment plate.

10. The power conversion apparatus according to claim 9, further comprising a sealing member fixed at an interface between the compartment plate and the coolant lid.

* * * * *